United States Patent
Hera et al.

(10) Patent No.: US 11,374,663 B2
(45) Date of Patent: Jun. 28, 2022

(54) VARIABLE-FREQUENCY SMOOTHING

(71) Applicant: Bose Corporation, Framingham, MA (US)

(72) Inventors: Cristian Marius Hera, Lancaster, MA (US); Elie Bou Daher, Marlborough, MA (US)

(73) Assignee: Bose Corporation, Framingham, MA (US)

( * ) Notice: Subject to any disclaimer, the term of this patent is extended or adjusted under 35 U.S.C. 154(b) by 154 days.

(21) Appl. No.: 16/691,196

(22) Filed: Nov. 21, 2019

(65) Prior Publication Data

US 2021/0159989 A1 May 27, 2021

(51) Int. Cl.
*H04B 17/309* (2015.01)
*G01R 29/26* (2006.01)
*H04B 1/04* (2006.01)

(52) U.S. Cl.
CPC .......... *H04B 17/309* (2015.01); *G01R 29/26* (2013.01); *H04B 1/0483* (2013.01)

(58) Field of Classification Search
CPC .......... G01R 29/26; G10L 2019/0012; G10L 21/0232; H04B 17/309; H04B 1/0483; H03M 13/1575
See application file for complete search history.

(56) References Cited

U.S. PATENT DOCUMENTS

| | | | | |
|---|---|---|---|---|
| 6,542,869 B1* | 4/2003 | Foote | ........................ | G10H 1/00 704/500 |
| 8,577,675 B2* | 11/2013 | Jelinek | ................ | G10L 21/0208 704/225 |
| 2010/0280827 A1* | 11/2010 | Mukerjee | .............. | G10L 15/197 704/236 |
| 2011/0178807 A1* | 7/2011 | Yang | ..................... | G10L 19/093 704/500 |
| 2014/0177871 A1* | 6/2014 | Morton | .................... | H04R 3/04 381/99 |

(Continued)

OTHER PUBLICATIONS

"A Computationally Efficient Noise Estimation Algorithm for Speech Enhancement"; Reju et al.; The 2004 IEEE Asia-Pacific Conference on Circuits and Systems; Dec. 6, 2004 (Year: 2004).*

(Continued)

*Primary Examiner* — Benjamin H Elliott, IV
(74) *Attorney, Agent, or Firm* — Fish & Richardson P.C.

(57) ABSTRACT

A method includes receiving a set of time domain samples representing audio captured using one or more microphones, and generating, from the time domain samples, a spectrum comprising a set of frequency domain coefficients, each coefficient representing a frequency bin corresponding to a range of frequencies. The method also includes adjusting the spectrum to generate a smoothed spectrum, wherein generating the smoothed spectrum includes determining that a magnitude of a first frequency domain coefficient is less than a threshold, and in response, replacing the first frequency domain coefficient by a value computed as a function of a plurality of frequency domain coefficients that include the first frequency domain coefficient. The method further includes generating an audio signal based on time domain samples computed using the smoothed spectrum.

20 Claims, 8 Drawing Sheets

(56) References Cited

U.S. PATENT DOCUMENTS

| | | | |
|---|---|---|---|
| 2014/0249807 A1* | 9/2014 | Vaillancourt | G10L 21/0224 |
| | | | 704/207 |
| 2016/0029124 A1* | 1/2016 | Paranjpe | G10L 21/0232 |
| | | | 381/71.14 |
| 2016/0037268 A1* | 2/2016 | Merks | G10L 21/0208 |
| | | | 381/313 |
| 2017/0034623 A1* | 2/2017 | Christoph | H04S 7/307 |
| 2019/0068320 A1* | 2/2019 | Vojcic | H03M 13/3707 |
| 2019/0198005 A1* | 6/2019 | Cheung | G10K 11/17881 |
| 2019/0206420 A1* | 7/2019 | Kandade Rajan | G10L 15/20 |
| 2021/0158806 A1* | 5/2021 | Hera | G10L 15/20 |
| 2021/0159989 A1* | 5/2021 | Hera | G01R 29/26 |

OTHER PUBLICATIONS

"Signal Modeling Techniques in Speech Recognition"; Picone; Proceedings of the IEEE, vol. 81, No. 9; Sep. 1993 (Year: 1993).*

"Single-Channel Speech Enhancement in Variable Noise-Level Environment"; Lin; IEEE Transactions on Systems, Man, and Cybernetics—Part A: Systems and Humans, vol. 33, No. 1, Jan. 2003 (Year: 2003).*

Cohen "Noise spectrum estimation in adverse environments: Improved minima controlled recursive averaging," IEEE Transactions on speech and audio processing, Sep. 2003, 11: 466-474.

Martin, "Noise power spectral density estimation based on optimal smoothing and minimum statistics," IEEE Transactions on Speech and Audio Processing, 2001, 9(5):504-512.

* cited by examiner

VARIABLE-FREQUENCY SMOOTHING

TECHNICAL FIELD

This disclosure generally relates to noise estimation, e.g., to overcome the effect of noise on speech enhancement systems disposed in vehicles.

BACKGROUND

The perceived quality of music or speech in a moving vehicle may be degraded by variable acoustic noise present in the vehicle. This noise may result from, and be dependent upon, vehicle speed, road condition, weather, and condition of the vehicle. The presence of noise may hide soft sounds of interest and lessen the fidelity of music or the intelligibility of speech.

SUMMARY

In one aspect, this document features a method that includes receiving a set of time domain samples representing audio captured using one or more microphones, and generating, from the time domain samples, a spectrum comprising a set of frequency domain coefficients, each coefficient representing a frequency bin corresponding to a range of frequencies. The method also includes adjusting the spectrum to generate a smoothed spectrum, wherein generating the smoothed spectrum includes determining that a magnitude of a first frequency domain coefficient is less than a threshold, and in response, replacing the first frequency domain coefficient by a value computed as a function of a plurality of frequency domain coefficients that include the first frequency domain coefficient. The method further includes generating an audio signal based on time domain samples computed using the smoothed spectrum.

In another aspect, this document features a system that includes a noise analysis engine and a reconstruction engine. The noise analysis engine is configured to receive a set of time domain samples representing audio captured using one or more microphones, generate, from the time domain samples, a spectrum comprising a set of frequency domain coefficients, each coefficient representing a frequency bin corresponding to a range of frequencies, and adjust the spectrum to generate a smoothed spectrum. Generating the smoothed spectrum includes determining that a magnitude of a first frequency domain coefficient is less than a threshold, and in response, replacing the first frequency domain coefficient by a value computed as a function of a plurality of frequency domain coefficients that include the first frequency domain coefficient. The reconstruction engine generates an audio signal based on time domain samples computed using the smoothed spectrum.

In another aspect, this document features one or more non-transitory machine-readable storage devices storing machine-readable instructions that cause one or more processing devices to execute various operations. The operations include receiving a set of time domain samples representing audio captured using one or more microphones, and generating, from the time domain samples, a spectrum comprising a set of frequency domain coefficients, each coefficient representing a frequency bin corresponding to a range of frequencies. The operations also include adjusting the spectrum to generate a smoothed spectrum, wherein generating the smoothed spectrum includes determining that a magnitude of a first frequency domain coefficient is less than a threshold, and in response, replacing the first frequency domain coefficient by a value computed as a function of a plurality of frequency domain coefficients that include the first frequency domain coefficient. The operations further include generating an audio signal based on time domain samples computed using the smoothed spectrum.

Implementations of the above aspects can include one or more of the following features.

A determination may be made that a magnitude of a second frequency domain coefficient is larger than or equal to the threshold, and in response, the second frequency domain coefficient can be retained in the smoothed spectrum. Generating the spectrum can include modifying at least some of the frequency domain coefficients using a gain function that is based on estimates of noise and/or speech level. The threshold can represent an upper limit of noise spectrum in the absence of speech. The value that replaces the first frequency domain coefficient can be computed as a dot product between the plurality of frequency domain coefficients and a window function. The window function can include at least one of: a rectangular window, a Hamming window, or a Hanning window. The one or more microphones can be disposed to capture the audio from within a vehicle cabin.

In some implementations, the technology described herein may provide one or more of the following advantages.

By adaptively changing a time constant for smoothing a power spectrum of signals containing noise, speech and other wanted or unwanted components, across multiple time frames, averaging/removal of noise fluctuations may be improved, for example, by selecting a short time constant during speech pauses and selecting a relatively larger time constant during absence of speech activity. This may improve the accuracy of a noise estimate, which in turn improves the functioning of an underlying speech recognition system or an audio adjustment system. In addition, allowing the time constants to vary from one frequency bin to another, the noise estimation process can be made more flexible. Accuracy of the noise estimates may be improved by averaging the estimates over multiple neighboring frequency bins. In some implementations, the smoothing over time and frequency can be performed one after the other to generate noise estimates that reduce distortions in the reconstructed speech, and/or improve the performance of the corresponding noise reduction/suppression or post-filtering systems.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

The technology described in this document is generally directed at reducing effects of noise perceived within a noisy environment such as a vehicle cabin. Certain aspects described herein pertain to generating estimates of a noise floor at various frequencies such that the estimates can be used in various audio processing applications. Examples of such audio processing applications include generating noise-reduced estimates of speech signal that are provided as inputs to speech recognition systems, and mitigating the effect of noise on a perceived quality of an audio reproduction system by dynamically adjusting a gain (volume) of an output as a function of noise level. In order to strike a balance between eliminating effects of noise spikes from corrupting the estimates of noise floors, and differentiating between noise spikes and speech signals, one aspect of the technology described herein espouses the use of an adaptive time smoothing process. In the adaptive process, in the absence of speech activity, a large time constant is used for smoothing noise estimates for a particular frequency bin over multiple time frames. On the other hand, when speech activity is detected, the time constant is reduced to a low value such that the noise estimates for the particular frequency bin are smoothed over frames representing speech-gaps. In another aspect, to reduce the effects of incorrect estimates for particular frequency bins (manifested, for example, by a phenomenon known as musical noise), the technology described herein also espouses smoothing the estimates over multiple contiguous frequency bins. In additional aspects, this document also describes various schemes of using two-dimensional (2D) time-frequency masks to implement the time and frequency smoothing concurrently.

Because the gain adjustment to maintain a target SNR reacts to changing noise levels, in some cases it may be desirable to base the computation of the SNR on steady-state noise that does not include noise spikes and/or noise irrelevant to the adjustments. For example, speech sounds from the occupants of the vehicle and/or any noise spike due to the vehicle going over a pothole may be considered irrelevant for adjusting the gain of the audio system, and therefore be excluded from the estimation of steady state noise. On the other hand, noise components such as engine noise, harmonic noise, and/or road noise perceived within the vehicle cabin may be considered relevant to estimating the steady-state noise that the gain adjustment system reacts to. In general, the term steady-state noise, as used in this document, refers to noise that is desired to be mitigated within the noise-controlled environment. For example, the steady-state noise can include engine noise, road noise etc., but excludes noise spikes and/or speech and/or other sounds made by the occupant(s) of the vehicle.

Figure 1:
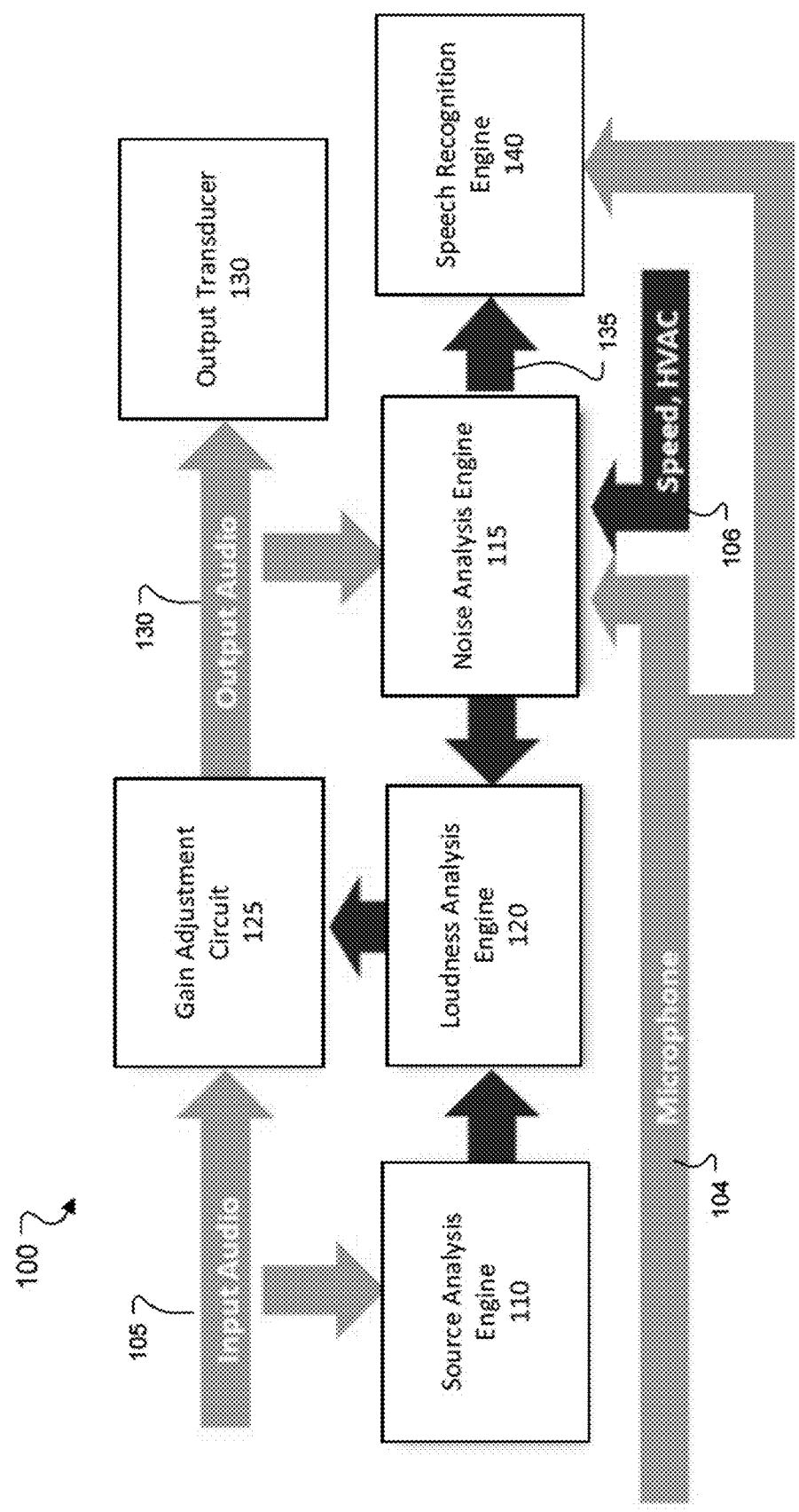
FIG. 1 is a block diagram of an example audio processing system disposed in a vehicle.

FIG. 1 is a block diagram of an example audio processing system disposed in a vehicle, and serves as an example of an environment in which the technology described herein may be implemented. In the example, system 100, the input audio signal 105 is first analyzed to determine a current record level of the input audio signal 105. This can be done, for example, by a source analysis engine 110. In parallel, a noise analysis engine 115 can be configured to analyze the level and profile of the noise present in the vehicle cabin. In some implementations, the noise analysis engine can be configured to make use of multiple inputs such as a microphone signal 104 and one or more auxiliary noise input 106 including, for example, inputs indicative of the vehicle speed, fan speed settings of the heating, ventilating, and air-conditioning system (HVAC) etc. In some implementations, the estimate of steady state noise generated by the noise analysis engine 115 can be provided to a speech recognition engine 140 that processes the microphone signal 104 based on the estimate of the noise, and performs speech recognition on the noise-reduced speech signals. In some implementations, a loudness analysis engine 120 may be deployed to analyze the outputs of the source analysis engine 110 and the noise analysis engine 115 to compute any gain adjustments needed to maintain a perceived quality of the audio output. In some implementations, the target SNR can be indicative of the quality/level of the input audio 105 as perceived within the vehicle cabin in the presence of steady-state noise. The loudness analysis engine can be configured to generate a control signal that controls the gain adjustment circuit 125, which in turn adjusts the gain of the input audio signal 105, possibly separately in different spectral bands to perform tonal adjustments, to generate the output audio signal 130. In some implementations, a noise-reduced version of the microphone signal can also be used, for example, for a phone call.

The level of the input audio signal and the noise level may be measured as decibel sound pressure level (dBSPL). For example, the source analysis engine 110 can include a level detector that outputs a scalar dBSPL estimate usable by the loudness analysis engine 120. The noise analysis engine 115 can also be configured to estimate the noise as a dBSPL value.

Figure 2:
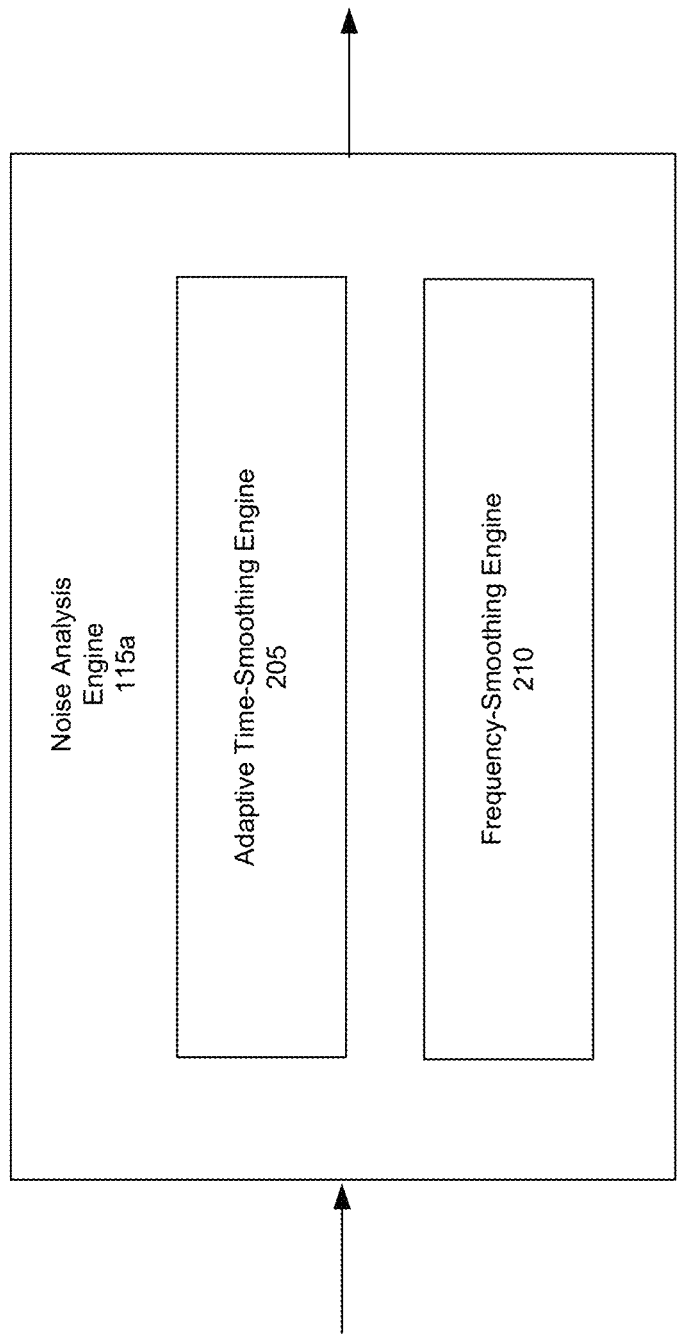
FIG. 2 is a block diagram of an example noise analysis engine that may be used in the system depicted in FIG. 1.

FIG. 2 is a block diagram of an example 115a of a noise analysis engine 115. In some implementations, the noise analysis engine 115 includes an adaptive time-smoothing engine 205 configured to average samples of noise over time to obtain an estimate of a noise floor. The noise estimate for noise suppression can be obtained, for example, using minimum statistics which tracks the minimum values of a smoothed power estimate of the noisy speech signal. In some cases, the underlying assumption can be that the power spectrum of the noisy speech signal drops to the level of the noise during pauses in the speech and in the absence of speech activity. In such cases, by tracking the minimum of the smoothed spectrum, a good estimate of the noise can be obtained. In the absence of speech activity, a large smoothing constant (that averages the signal samples over a longer period) is preferred to obtain an accurate noise estimate and remove fluctuations. On the other hand, in the presence of speech activity, a smaller averaging constant (faster averaging) can be used to allow the smoothed spectrum to drop to the noise level during speech pauses. Such a time-smoothing scheme is described graphically, using the time-frequency bins illustration of FIG. 3A, where each row represents multiple frequency bins at a given time, and each column represents multiple time points at a particular frequency. The variable time smoothing to improve the accuracy of the noise estimate can be defined as follows:

$$E_{sm}(k, n_f) = \begin{cases} [1 - \alpha(k)] \cdot |E(k, n_f)| + \alpha(k) \cdot E_{sm}(k, n_f - 1), & \\ \quad \text{if } |E(k, n_f)| \leq Th(k) \\ |E(k, n_f)|, \text{ if } |E(k, n_f)| > Th(k) \end{cases} \quad (1)$$

Figure 3C:
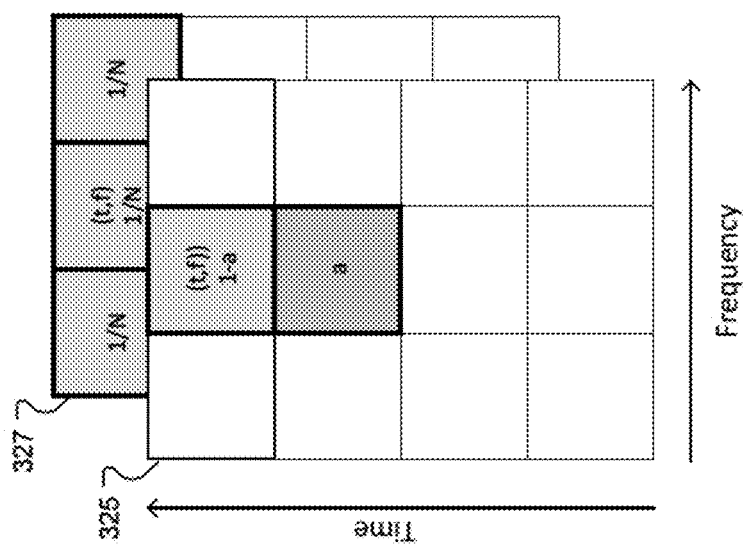
FIGS. 3A-3C are representations of time-frequency bins illustrating various smoothing schemes described herein.

$E_{sm}(k, n_f)$ is the smoothed noisy speech spectrum for the bin k at the current frame $n_f$ and $E(k, n_f)$ is the corresponding unsmoothed spectrum. Referring to FIG. 3A, the bin 305 corresponds to the current bin $(k, n_f)$ at time t and frequency f, and the bin 310 corresponds to the bin corresponding to the same frequency f (denoted by the same frequency index k), but for the previous time frame $n_f-1$ at time (t−1) that has been smoothened in the previous step. As per equation (1), no smoothing is performed ($\alpha=0$) for bin levels above a certain threshold Th(k). For levels below the threshold, the bin magnitude is smoothed with a time constant $\alpha(k)$, with $0<\alpha(k)<1$. Even though the smoothing factor $\alpha(k)$ is denoted as a function of the bin k, in some implementations, the soothing factor can be constant across frequency bins. The underlying assumption of the process represented by equation (1) is that if the power spectrum goes above the predetermined threshold, it is most likely due to the presence of speech, and therefore no smoothing is required. The adaptive smoothing engine 205 computes a smoothed magnitude spectrum using a process denoted by equation (1). In some implementations, the adaptive smoothing engine 205 can be configured to compute the smoothing on the squared magnitude spectrum $|E_{sm}(k, n_f)|^2$, as represented by replacing the $|E_{sm}(k, n_f)|$ by $|E_{sm}(k, n_f)|^2$ in equation (1), to obtain an estimate of the power spectral density of the noise.

In some implementations, the adaptive time-smoothing engine 205 can be configured to adaptively calculate the threshold Th(k). This can be done, for example, by tracking information about a current noise level. In some implementations, the threshold can be chosen as the maximum value attained by the noisy speech spectrum in the absence of speech. The maximum can be computed, for example, over a sliding window in the absence of speech, and then frozen (or held at a constant value) during speech activity. The tracking can again be resumed once speech activity is determined to have ended. Tracking the maximum as the threshold can be a good measure of the high point of the noise floor in the absence of speech activity. When speech activity starts, any values that exceed the threshold can therefore be assumed to be due to the speech, and thus left unsmoothed.

Figure 4A:
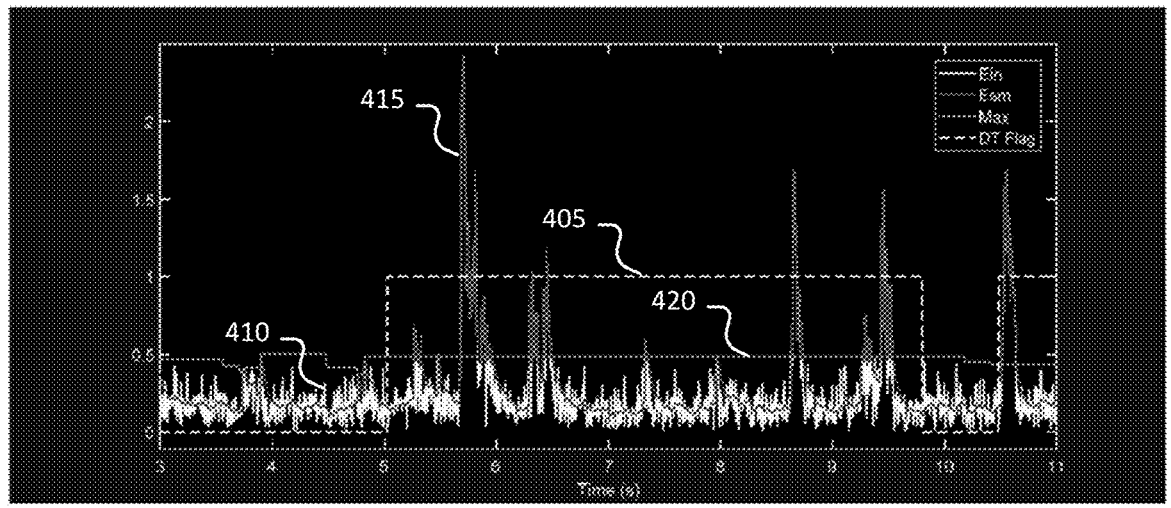
FIGS. 4A and 4B are plots illustrating the adaptive time-smoothing described herein.
Figure 4B:
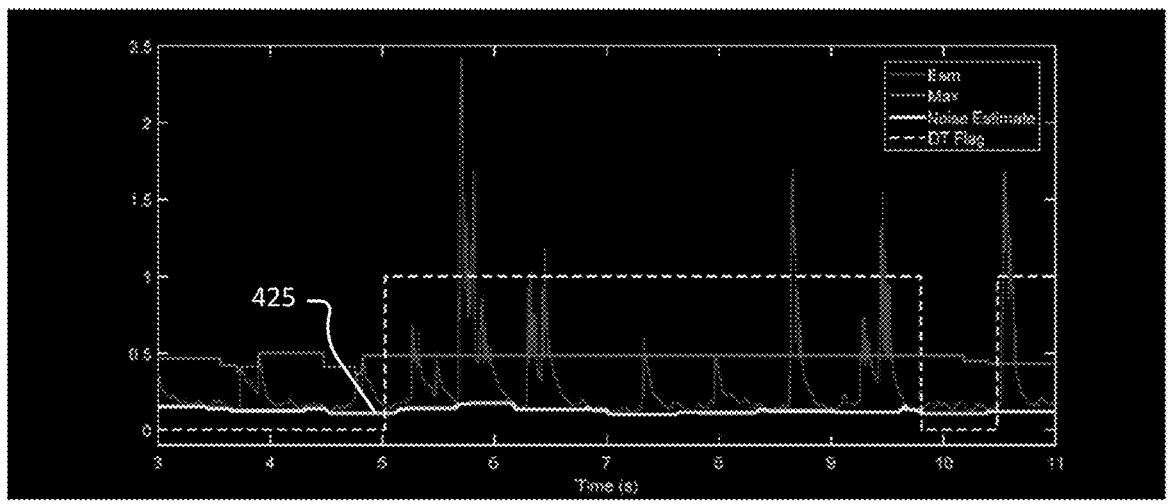

FIGS. 4A and 4B are plots illustrating the adaptive time-smoothing described that may be implemented by the adaptive time-smoothing engine 205. Specifically, FIG. 4A shows an example of the variable time smoothing at a particular frequency bin. The dashed line 405 denotes periods of speech activity, which in this example, starts around 5 s. The curve 410 shows the unsmoothed noisy speech magnitude, and the curve 415 shows the smoothed noisy speech magnitude. The line 420 represents a running account of the threshold, which is computed as the maximum of the unsmoothed noisy speech magnitude in the absence of speech activity, but held unchanged during speech activity periods. It is evident that when the unsmoothed noisy speech magnitude 410 goes above the threshold 420, no smoothing is performed and the smoothed magnitude 415 coincides with the unsmoothed magnitude 410 (e.g., within the speech periods denoted by the line 405). On the other hand, when the unsmoothed magnitude 410 goes below the threshold 420, smoothing is performed. FIG. 4B shows the noise floor estimate 425 for the example of FIG. 4A, the noise floor estimate being obtained as the minimum of the smoothed magnitude 415 of the noisy speech signal over a window. The line 425 shows the noise floor estimate for the particular frequency f, and the process is repeated for other frequencies for obtaining time-variable noise floor estimates for different frequencies.

In some implementations, estimation errors at one or more frequencies can lead to artifacts such as musical noise. Musical noise is a randomly fluctuating type of noise which often arises in speech enhancement systems that rely on decomposition of speech and noise in the frequency domain and modification of the spectral coefficients with a gain function based on estimates of noise and/or speech levels. Musical noise can result from incorrect estimation of noise or residual echo. In some implementations, the estimates of the noise floor can be improved using frequency smoothing. However, averaging over multiple frequencies can result in a degradation of speech quality. For example, due to the averaging of the bin values for different frequencies, spikes in the frequency spectrum that are due to speech may get smoothed out thereby resulting in speech distortion.

Referring back to FIG. 2, the noise analysis engine 115 can include a frequency smoothing engine 210 configured to reduce the fluctuations in the estimates by averaging the estimate at each frequency with the estimates for the neighboring frequencies for the same time point, while minimizing the resulting impact on the speech quality. This can be done, for example, by leaving bin values that exceed a threshold value unchanged, and implementing a smoothing process on bin values that do not exceed the threshold. The smoothing process can be implemented, for example, as a convolution between the estimated spectrum and a window function. The threshold can be selected, for example, as the current maximum of the noise spectrum computed in the absence of speech activity.

In some implementations, the length of the window function dictates the number of frequency bins that are used for averaging, and/or the window type dictates the weights that are assigned for each frequency bin. Examples of window functions that can be used include rectangular window, Hamming window, Hanning window, triangular window, or other window functions. A window function, as used herein, refers to a mathematical function that is zero-valued outside of a selected interval (also known as the window length), and is typically symmetric around the middle of the interval. The maximum value of the window function is usually in the middle, with the values symmetrically tapering away from the middle.

Figure 3B:
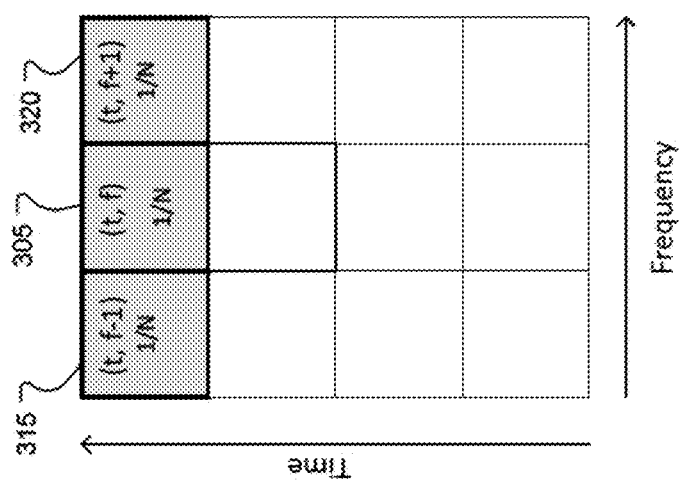
Figure 3A:
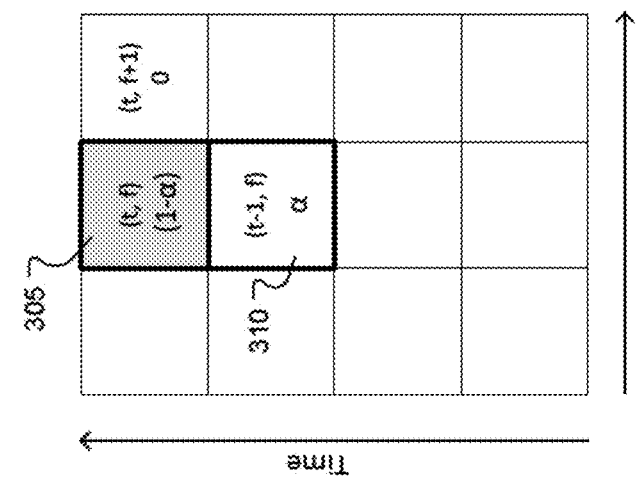

The frequency smoothing process implemented by the frequency smoothing engine 210 is graphically illustrated using the time-frequency bins of FIG. 3B. In this example, the bin 305 corresponds to the current bin $(k, n_f)$ at time t and frequency f, the bin 315 is the bin corresponding to the preceding frequency f−1 at time t, and the bin 320 is the bin corresponding to the next frequency f+1 also at time t. In the example of FIG. 3B, the smoothed value for the bin 305 is calculated as an average of the three bins. This corresponds to a rectangular window of length N and amplitude 1/N, and N=3. While this particular example illustrates the ideas using an averaging over three bins, a different number of bins (corresponding to different length of windows) can be used for implementing the frequency smoothing process without deviating from the scope of this disclosure.

Figure 5:
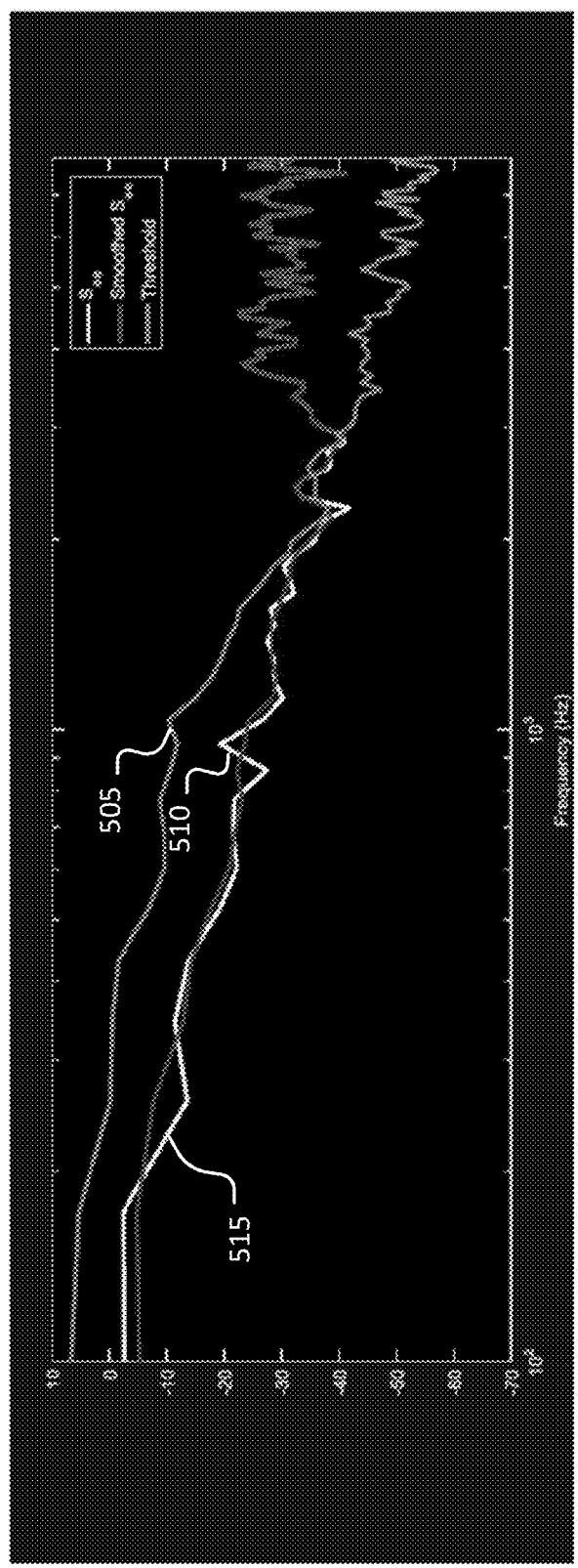
FIG. 5 is a plot illustrating the frequency-smoothing described herein.

FIG. 5 is a plot illustrating the frequency-smoothing described herein. In the example of FIG. 5, the line 505 represents the variable threshold (that varies as a function of frequency) above which no frequency smoothing is performed. The line 510 represents the unsmoothed power spectral density (PSD) of the error signal, and the line 515 is the smoothed PSD that is obtained using the variable frequency smoothing process described herein. In this example, the frequency smoothing is applied to the output of a noise reduction system. However, the same frequency smoothing process can be applied to smoothen the mask that is used in noise reduction. Because the frequency smoothing is only performed below the threshold, the line 515 represents a smoothed version of the line 510 below the threshold, but the two lines coincide above the threshold due to the absence of any smoothing process.

Referring back to FIG. 2, in some implementations, both the adaptive time-smoothing engine 205 and the frequency-smoothing engine 210 can be used in conjunction with one another. For example, a time smoothing can be first performed along the time dimension of the time-frequency representations (as represented in FIG. 3A), and the resulting values can be subjected to the frequency-smoothing process along the frequency dimension of the time-frequency representation (as represented in FIG. 3B). In some cases, if the time and/or frequency averaging is performed (i) along one dimension in either time dimension only, or frequency dimension only, or (ii) one followed by the other in a sequential manner, either scenario can in some cases lead to (1) speech distortion that presents itself in the form of "afterglow" or long trailing end of "smeared" speech and/or tonal shift towards higher frequencies; and (2) reduced performance when the output of the processes is used in noise reduction or post-filtering to reduce speech artifacts and/or improve speech intelligibility.

In some implementations, the averaging processes described above can be performed in two dimensions, e.g., sequentially in time and frequency. This is graphically represented in FIG. 3C, which shows both a time-smoothing scheme 325 followed by a frequency smoothing scheme 327.

Figure 6:
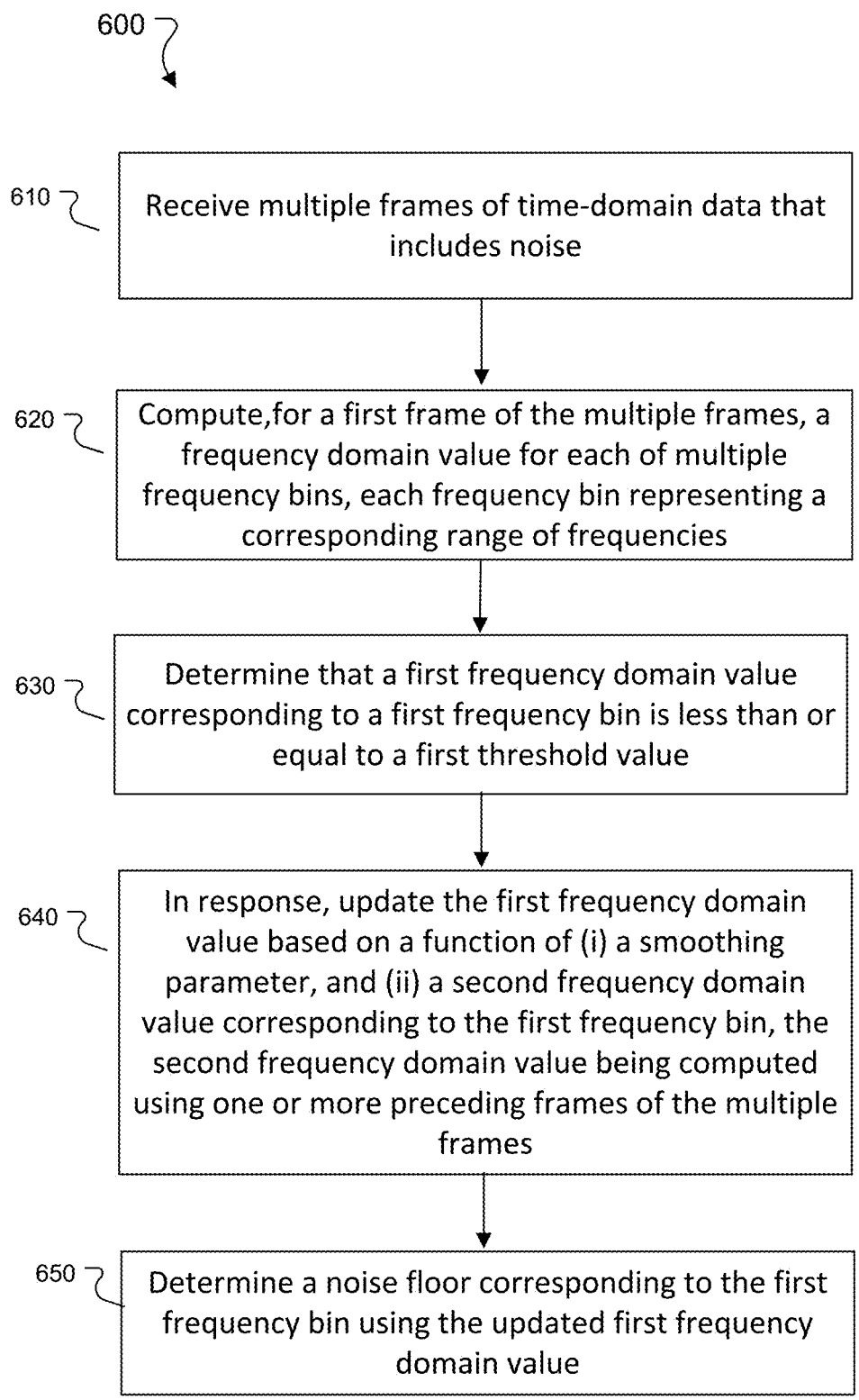
FIG. 6 is a flow chart of an example process for determining a noise floor using an adaptive time-smoothing scheme described herein.

FIG. 6 is a flow chart of an example process 600 for determining a noise floor using an adaptive time-smoothing scheme described herein. In some implementations, at least a portion of the process 600 can be performed by the noise analysis engine 115 using one or more processing devices. For example, at least a portion of the process 600 can be executed by the adaptive time-smoothing engine 205 described above with reference to FIG. 2. Operations of the process 600 can include receiving multiple frames of time-domain data that includes noise (610). The multiple frames of time domain data can be generated from the microphone signals 104. For example, the noise analysis engine 115 (or another portion of the audio processing system 100) can include an analog to digital converter that converts analog signals generated by one or more microphones to digital samples of time domain data that are divided into multiple frames of finite durations.

Operations of the process 600 also include computing, for a first frame of the multiple frames, a frequency domain value for each of multiple frequency bins, each frequency bin representing a corresponding range of frequencies (620). Each of the multiple frames can correspond to a time point (t, t−1, etc.) of the multiple time points described with reference to FIG. 3A-3C, and each of the frequency bins can correspond to a range of frequencies represented by the discrete frequencies f, (f−1), (f+1) etc. Correspondingly, each of the bin values in FIGS. 3A-3C can be the corresponding frequency domain value. For example, the frequency domain values can represent the magnitude spectrum, or a square of the magnitude spectrum. In some implementations, generating the spectrum comprises modifying at least some of the frequency domain coefficients using a gain function that is based on estimates of noise and/or speech level.

Operations of the process 600 also include determining that a first frequency domain value corresponding to a first frequency bin is less than or equal to a first threshold value (630). Referring back to the description corresponding to FIG. 3A, the threshold can be the parameter Th(k) as described in equation (1). In some implementations, the threshold can be variable, e.g., the first threshold value corresponding to the first frequency bin can be different from a second threshold value corresponding to a second frequency bin.

Operations of the process 600 also include, in response to determining that the first frequency domain value corresponding to the first frequency bin is less than or equal to the first threshold value, updating the first frequency domain value based on a function of (i) a smoothing parameter, and (ii) a second frequency domain value corresponding to the first frequency bin (640). The second frequency domain value can be computed using one or more preceding frames of the multiple frames. For example, in equation (1), the smoothing parameter is the parameter $\alpha(k)$, the first frequency domain value is the term $E(k, n_f)$, and the second frequency domain value is the value $E_{sm}(k, n_f-1)$ which is calculated based on the preceding time frame $n_f-1$. The term $E_{sm}(k, n_f)$ denotes the updated version of the first frequency domain value for the current frame $n_f$.

Operations of the process can also include determining a noise floor corresponding to the first frequency bin using the updated first frequency domain value (650). This can include, for example, determining that the updated first frequency domain value is less than a current value of noise floor corresponding to the first frequency bin, and in response, setting the updated frequency domain value as an updated current value of the noise floor corresponding to the first frequency bin In some implementations, the noise floor value can be dynamically updated as the minimum value in the smoothed spectrum over a duration of time. For example, a determination may be made that the updated first frequency domain value is less than a current value of the noise floor corresponding to the first frequency bin, and in response to such determination, the noise floor for that frequency bin can be updated to the current value. In some implementations, if another frequency domain value (e.g., a third frequency domain value corresponding to the same time frame) is determined as being less than the first threshold value, the noise floor can be determined using the third frequency domain value.

In some implementations, the first threshold value is a function of time, and the first threshold value is updated based on presence or absence of speech. This can include, for example, determining that speech is absent in the first frame, and responsive to determining that speech is absent in the first frame, selecting the first threshold value from multiple frequency domain values corresponding to the first frequency bin, as computed from the first frame and multiple preceding frames. This can also include determining that speech is present in the first frame, and in response, using a previous value of the first threshold as an updated value of the first threshold.

Figure 7:
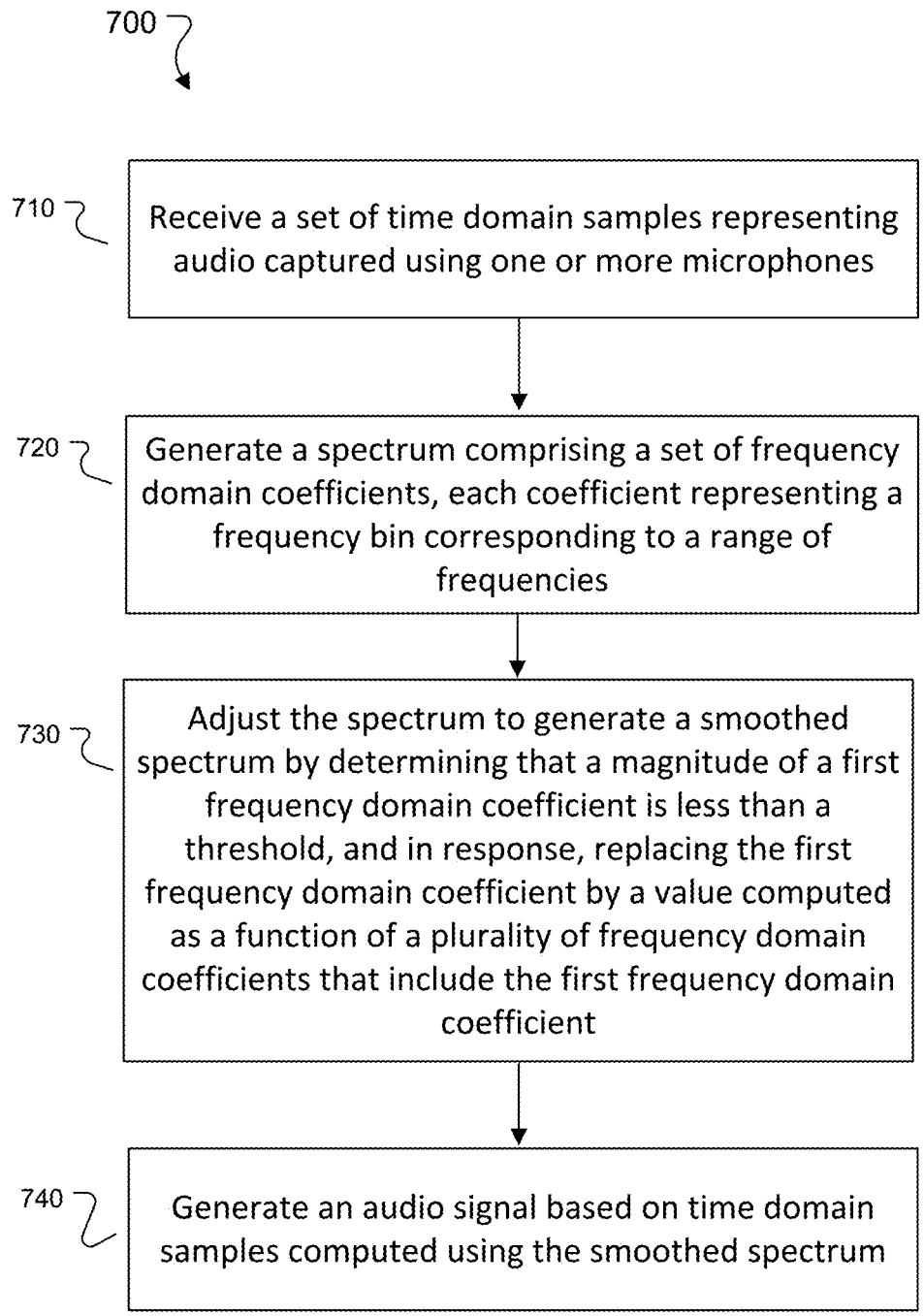
FIG. 7 is a flow chart of an example process for generating an audio signal using a frequency-smoothed spectrum in accordance with technology described herein.

FIG. 7 is a flow chart of an example process 700 for generating an audio signal using a frequency-smoothed spectrum in accordance with technology described herein. In some implementations, at least a portion of the process 700 can be performed by the noise analysis engine 115 using one or more processing devices. For example, at least a portion of the process 700 can be executed by the frequency-smoothing engine 210 described above with reference to FIG. 2. Operations of the process 700 can include receiving a set of time domain samples representing audio captured using one or more microphones (710). In some implementations, the one or more microphones are disposed to capture the audio from within a vehicle cabin. The audio captured by the one or more microphones can be represented, for example, the microphone signals 104 described with reference to FIG. 1, and can be generated by one or more analog to digital converters. For example, the noise analysis engine 115 (or another portion of the audio processing system 100) can include an analog to digital converter that converts analog signals generated by one or more microphones to digital samples of time domain data.

Operations of the process 700 also include generating, from the time domain samples, a spectrum comprising a set of frequency domain coefficients, each coefficient representing a frequency bin corresponding to a range of frequencies (720). For example, with reference to FIG. 3A-3C, each of the frequency bin can correspond to a range of frequencies represented by the discrete frequencies f, (f−1), (f+1) etc. Correspondingly, each of the bin values in FIGS. 3A-3C can be the corresponding frequency domain coefficient (also referred to herein as a frequency domain value). In some implementations, the frequency domain values can represent the magnitude spectrum, or a square of the magnitude spectrum. In some implementations, generating the spectrum can include modifying at least some of the frequency domain coefficients using a gain function that is based on estimates of noise and/or speech level.

Operations of the process 700 further include adjusting the spectrum to generate a smoothed spectrum (730). This can include, for example, determining that a magnitude of a first frequency domain coefficient is less than a threshold, and in response, replacing the first frequency domain coefficient by a value computed as a function of a plurality of frequency domain coefficients that include the first frequency domain coefficient. In some implementations, the value computed as a function of a plurality of frequency domain coefficients can be an average of multiple frequency domain coefficients. The process 700 can also include determining that a magnitude of a second frequency domain coefficient is larger than or equal to the threshold, and in response, retaining the second frequency domain coefficient in the smoothed spectrum.

The threshold, in some implementations, can represent an upper limit of the noise spectrum in the absence of speech. The value that replaces the first frequency domain coefficient can be computed, for example, as a dot product between the plurality of frequency domain coefficients and a window function, as described above with reference to FIG. 2. The window function can include at least one of: a rectangular window, a Hamming window, or a Hanning window.

The process 700 can also include generating an audio signal based on time domain samples computed using the smoothed spectrum (740). This can include, for example, passing the samples of the smoothed spectrum through a digital to analog converter to generate analog signals output by an acoustic transducer (e.g. an acoustic transducer 130 as described above with reference to FIG. 1). In some implementations, the smoothed spectrum can be used in determining a noise floor value, as described, for example with reference to FIG. 6.

The noise floor estimated using one or more of the time smoothing process or the frequency smoothing process can be used in various ways. For example, the noise floor estimates can be used to reduce noise for a speech recognition engine 140 described with reference to FIG. 1. In some implementations, an output of a vehicular audio system may be adjusted based on the estimate of the steady-state noise floor. This can be done, for example, by a loudness analysis engine 120 that utilizes the estimate of the steady-state noise floor to generate a control signal configured to control a gain adjustment circuit (that can include, for example, a variable gain amplifier (VGA)). In some implementations, an SNR can be computed based on the estimate of the steady-state noise, and the control signal can be generated responsive to determining that the SNR satisfies a threshold condition. The SNR can be indicative of a relative power of the output of the vehicular audio system compared to the power of the noise perceived in the vehicle cabin, as indicated, for example, by the estimate of the noise floor. In some implementations, responsive to determining that the SNR satisfies a threshold condition (which indicates that the SNR is within a threshold range from a target SNR), a current gain of the vehicular system may be maintained.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them.

Figure 8:
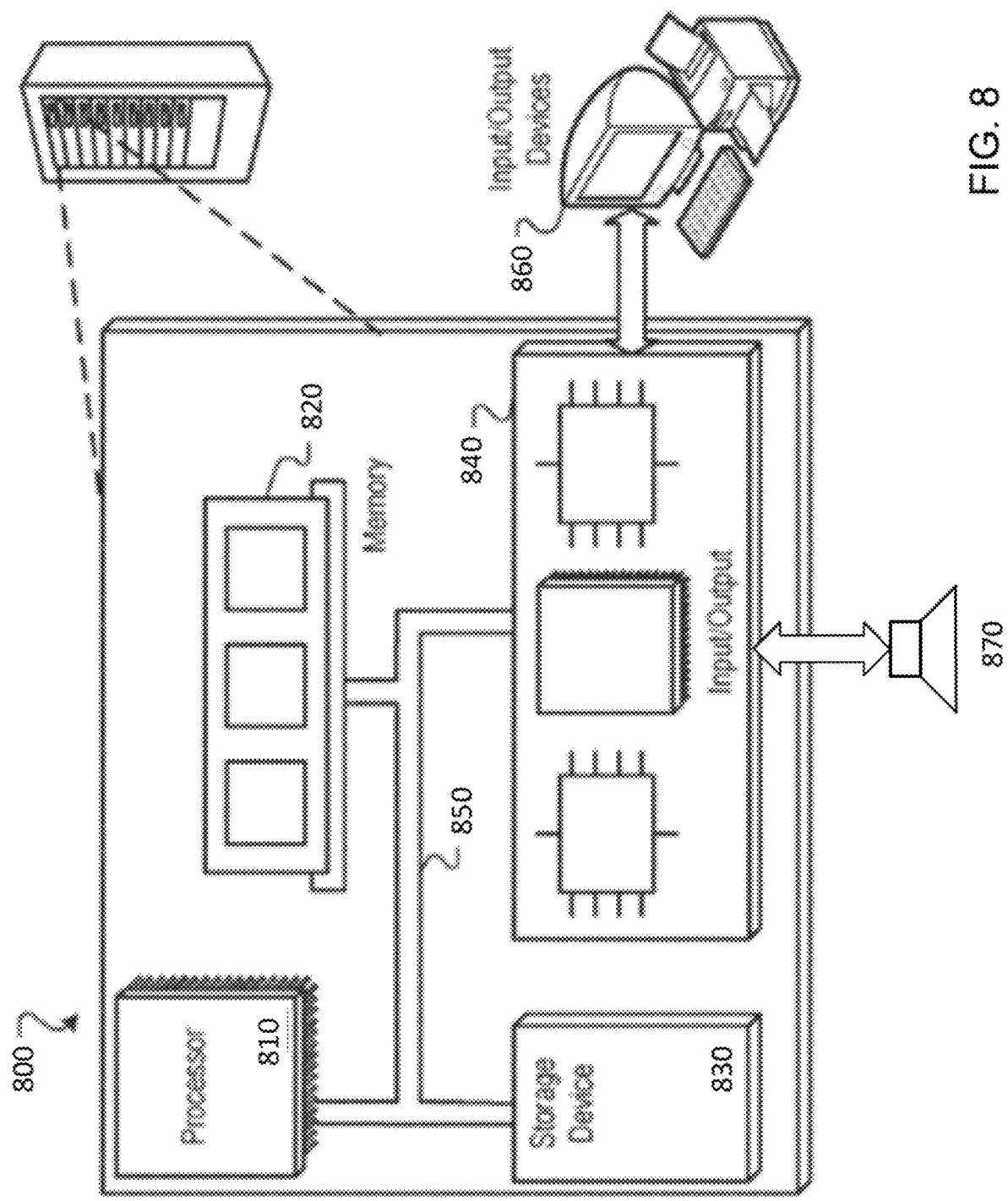
FIG. 8 is a block diagram of an example of a computing device.

FIG. 8 is block diagram of an example computer system 800 that can be used to perform operations described above. For example, any of the systems and engines described in connection to FIGS. 1, and 2 can be implemented using at least portions of the computer system 800. The system 800 includes a processor 810, a memory 820, a storage device 830, and an input/output device 840. Each of the components 810, 820, 830, and 840 can be interconnected, for example, using a system bus 850. The processor 810 is capable of processing instructions for execution within the system 800. In one implementation, the processor 810 is a single-threaded processor. In another implementation, the processor 810 is a multi-threaded processor. The processor 810 is capable of processing instructions stored in the memory 820 or on the storage device 830.

The memory 820 stores information within the system 800. In one implementation, the memory 820 is a computer-readable medium. In one implementation, the memory 820 is a volatile memory unit. In another implementation, the memory 820 is a non-volatile memory unit.

The storage device 830 is capable of providing mass storage for the system 800. In one implementation, the storage device 830 is a computer-readable medium. In various different implementations, the storage device 830 can include, for example, a hard disk device, an optical disk device, a storage device that is shared over a network by multiple computing devices (e.g., a cloud storage device), or some other large capacity storage device.

The input/output device 840 provides input/output operations for the system 800. In one implementation, the input/output device 840 can include one or more network interface devices, e.g., an Ethernet card, a serial communication device, e.g., and RS-232 port, and/or a wireless interface device, e.g., and 802.11 card. In another implementation, the input/output device can include driver devices configured to receive input data and send output data to other input/output devices, e.g., keyboard, printer and display devices 860, and acoustic transducers/speakers 870.

Although an example processing system has been described in FIG. 8, implementations of the subject matter and the functional operations described in this specification can be implemented in other types of digital electronic circuitry, or in computer software, firmware, or hardware, including the structures disclosed in this specification and their structural equivalents, or in combinations of one or more of them.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, which is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

Other embodiments and applications not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

While this specification contains many specific implementation details, these should not be construed as limitations on the scope of any claims or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

What is claimed is:

1. A method comprising:
receiving a first set of time domain samples;
generating, from the first set of time domain samples, an unsmoothed spectrum comprising a set of frequency domain coefficients, each coefficient representing a frequency bin corresponding to a range of frequencies;
adjusting the unsmoothed spectrum to generate a smoothed spectrum, wherein generating the smoothed spectrum comprises:
determining that a magnitude of a first frequency domain coefficient of the unsmoothed spectrum is less than a threshold, and
responsive to determining that a magnitude of the first frequency domain coefficient is less than the threshold, replacing the first frequency domain coefficient by a value computed as a function of a plurality of frequency domain coefficients that include the first frequency domain coefficient; and
generating an audio signal based on a second set of time domain samples computed using the smoothed spectrum.

2. The method of claim 1, further comprising:
determining that a magnitude of a second frequency domain coefficient is larger than or equal to the threshold, and
responsive to determining that a magnitude of a second frequency domain coefficient is larger than or equal to the threshold, retaining the second frequency domain coefficient in the smoothed spectrum.

3. The method of claim 1, wherein generating the unsmoothed spectrum comprises modifying at least some of the frequency domain coefficients using a gain function that is based on estimates of noise and/or speech level.

4. The method of claim 1, wherein the threshold represents an upper limit of noise spectrum in the absence of speech.

5. The method of claim 1, wherein the value that replaces the first frequency domain coefficient is computed as a dot product between the plurality of frequency domain coefficients and a window function.

6. The method of claim 5, wherein the window function includes at least one of: a rectangular window, a Hamming window, or a Hanning window.

7. The method of claim 1, wherein the first set of time domain samples represents audio captured using one or more microphones.

8. The method of claim 7, wherein the one or more microphones are disposed to capture the audio from within a vehicle cabin.

9. The method of claim 1, wherein the set of frequency domain coefficients represents noise floor estimates.

10. A system comprising:
a noise analysis engine including one or more processing devices, the noise analysis engine configured to:
receive a first set of time domain samples,
generate, from the first set of time domain samples, an unsmoothed spectrum comprising a set of frequency domain coefficients, each coefficient representing a frequency bin corresponding to a range of frequencies,
adjust the unsmoothed spectrum to generate a smoothed spectrum, wherein generating the smoothed spectrum comprises:
determining that a magnitude of a first frequency domain coefficient of the unsmoothed spectrum is less than a threshold, and
responsive to determining that a magnitude of the first frequency domain coefficient is less than the threshold, replacing the first frequency domain coefficient by a value computed as a function of a plurality of frequency domain coefficients that include the first frequency domain coefficient; and
a reconstruction engine that generates an audio signal based on a second set of time domain samples computed using the smoothed spectrum.

11. The system of claim 10, wherein the noise analysis engine is configured to:
determine that a magnitude of a second frequency domain coefficient is larger than or equal to the threshold, and
responsive to determining that a magnitude of a second frequency domain coefficient is larger than or equal to the threshold, retain the second frequency domain coefficient in the smoothed spectrum.

12. The system of claim 10, wherein generating the unsmoothed spectrum comprises modifying at least some of the frequency domain coefficients using a gain function that is based on estimates of noise and/or speech level.

13. The system of claim 10, wherein the threshold represents an upper limit of noise spectrum in the absence of speech.

14. The system of claim 10, wherein the value that replaces the first frequency domain coefficient is computed as a dot product between the plurality of frequency domain coefficients and a window function.

15. The system of claim 14, wherein the window function includes at least one of: a rectangular window, a Hamming window, or a Hanning window.

16. The system of claim 10, wherein the first set of time domain samples represents audio captured using one or more microphones.

17. The system of claim 16, wherein the one or more microphones are disposed to capture the audio from within a vehicle cabin.

18. The system of claim 10, wherein the set of frequency domain coefficients represents noise floor estimates.

19. One or more non-transitory machine-readable storage devices storing machine-readable instructions that cause one or more processing devices to execute operations comprising:
receiving a set of time domain samples representing audio captured using one or more microphones;
generating, from the time domain samples, an unsmoothed spectrum comprising a set of frequency domain coefficients, each coefficient representing a frequency bin corresponding to a range of frequencies;

adjusting the unsmoothed spectrum to generate a smoothed spectrum, wherein generating the smoothed spectrum comprises:
determining that a magnitude of a first frequency domain coefficient of the unsmoothed spectrum is less than a threshold, and
responsive to determining that a magnitude of the first frequency domain coefficient is less than the threshold, replacing the first frequency domain coefficient by a value computed as a function of a plurality of frequency domain coefficients that include the first frequency domain coefficient; and
generating an audio signal based on time domain samples computed using the smoothed spectrum.

20. The one or more non-transitory machine-readable storage devices of claim 15, wherein the operations further comprise:
determining that a magnitude of a second frequency domain coefficient is larger than or equal to the threshold, and
responsive to determining that a magnitude of a second frequency domain coefficient is larger than or equal to the threshold, retaining the second frequency domain coefficient in the smoothed spectrum.

* * * * *